(12) United States Patent
Nagai et al.

(10) Patent No.: US 8,034,659 B2
(45) Date of Patent: Oct. 11, 2011

(54) PRODUCTION METHOD OF SEMICONDUCTOR DEVICE AND BONDING FILM

(75) Inventors: Akira Nagai, Tsukuba (JP); Masaaki Yasuda, Tsukuba (JP); Keiichi Hatakeyama, Tsukuba (JP); Tetsuya Enomoto, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 185 days.

(21) Appl. No.: 12/306,285

(22) PCT Filed: Jun. 20, 2007

(86) PCT No.: PCT/JP2007/062427
§ 371 (c)(1),
(2), (4) Date: Sep. 9, 2009

(87) PCT Pub. No.: WO2007/148724
PCT Pub. Date: Dec. 27, 2007

(65) Prior Publication Data
US 2010/0003771 A1    Jan. 7, 2010

(30) Foreign Application Priority Data

Jun. 23, 2006 (JP) .............................. P2006-173736
Nov. 7, 2006 (JP) .............................. P2006-301766

(51) Int. Cl.
*H01L 21/00* (2006.01)
(52) U.S. Cl. .. 438/108; 438/113; 438/118; 257/E21.519
(58) Field of Classification Search .................. 438/108, 438/113, 118; 257/E21.519
See application file for complete search history.

(56) References Cited

U.S. PATENT DOCUMENTS 6,638,865 B2* 10/2003 Tanaka .......................... 438/692
(Continued)

FOREIGN PATENT DOCUMENTS

| JP | 01-280334 | 11/1989 |
| JP | 6-69323 A | 3/1994 |
| JP | 2833111 A | 10/1998 |

(Continued)

OTHER PUBLICATIONS

Korean Office Action issued in co-pending related application 10-2011-7002434, dated Apr. 11, 2011 (no translation available; submitted for certification purposes only).

(Continued)

*Primary Examiner* — Trung Q Dang
(74) *Attorney, Agent, or Firm* — Griffin & Szipl, P.C.

(57) ABSTRACT

To provide a method of manufacturing semiconductor devices, the method being capable of efficiently obtaining a singulated semiconductor chip upon which an adhesive is adhered and also capable of excellently bonding a semiconductor chip to a wiring substrate, and provide an adhesive film. A layered product 60 in which a dicing tape 9, an adhesive layer 3, and a semiconductor wafer 6 are stacked in this order so that a circuit surface 6a of the semiconductor wafer 6 may face the dicing tape 9 side. A cutting position is recognized by recognizing a circuit pattern P in the circuit surface 6a from a rear surface 6b of the semiconductor wafer 6. At least the semiconductor wafer 6 and the adhesive layer 3 are cut in the thickness direction of the layered product 60. The dicing tape 9 is cured to peel off the dicing tape 9 and the adhesive layer 3. A projection electrode 4 of a semiconductor chip 26 is aligned with a wiring 12 of a wiring substrate 40. The wiring substrate 40 and the semiconductor chip 26 are bonded via an adhesive layer 23 so that the wiring 12 and the projection electrode 4 may be electrically connected to each other.

13 Claims, 10 Drawing Sheets

U.S. PATENT DOCUMENTS

| | | | |
|---|---|---|---|
| 2007/0141330 A1 | 6/2007 | Morishima et al. | |
| 2007/0218586 A1* | 9/2007 | Yoshimura et al. | 438/106 |
| 2008/0315434 A1* | 12/2008 | McElrea et al. | 257/777 |

FOREIGN PATENT DOCUMENTS

| | | |
|---|---|---|
| JP | 11-330013 | 11/1999 |
| JP | 2002-252245 A | 9/2002 |
| JP | 2004-179616 A | 6/2004 |
| JP | 2004-320057 | 11/2004 |
| JP | 2005-340431 A | 12/2005 |
| JP | 2006-049482 A | 2/2006 |
| JP | 2006-093285 A | 4/2006 |
| KR | 10-2003-0086450 | 11/2003 |

OTHER PUBLICATIONS

Yoshinobu Homma, "Problems and possibility of flip chip assembly techniques—Underfill materials for flip chip", Electronic Materials, Kogyo Chosakai Publishing Co., Ltd., Sep. 1, 2000, vol. 39, No. 9, pp. 36-40.

Katsuyuki Mizuike, Eiichi Nomura, "Underfill materials for flip chip", Electronic Technology, Nikkan Kogyo Shimbun Ltd., Sep. 2001, extra edition, pp. 82-83.

Kazutoshi Iida, "Development of materials for bare chip mounting", Electronic Technology, Nikkan Kogyo Shimbun Ltd., Sep. 2001, extra edition, pp. 84-87.

International Search Report issued in corresponding application No. PCT/JP2007/062427, completed Sep. 6, 2007 and mailed Sep. 18, 2007.

English translation of International Preliminary Report on Patentability issued in corresponding application No. PCT/JP2007/062427 on Feb. 3, 2009.

Office Action issued in related Japanese application 2008-522496 on Aug. 23, 2011.

* cited by examiner (A)

(B)

(C)

(A)

(D)

(B)

(E)

(C)

(A)

(B)

(C)

(A)

(B)

(C)

(A)

(B)

(C)

(A)

(B)

PRODUCTION METHOD OF SEMICONDUCTOR DEVICE AND BONDING FILM

This is a National Phase Application in the United States of International Patent Application No. PCT/JP2007/062427 filed Jun. 20, 2007, which claims priority on Japanese Patent Applications No. P2006-173736 filed Jun. 23, 2006 and P2006-301766 filed Nov. 7, 2006. The entire disclosures of the above patent applications are hereby incorporated by reference.

TECHNICAL FIELD

The present invention relates to a method of manufacturing semiconductor devices, and to adhesive films.

BACKGROUND ART

As the method of bonding a semiconductor chip to a substrate, a flip chip bonding method is known. In this bonding method, a semiconductor chip is arranged with the circuit surface thereof facing the substrate side. The electrical connection is made by bonding a projection electrode called a bump formed in the circuit surface of the semiconductor chip to a terminal formed in the substrate. The flip chip bonding method is advantageous in miniaturizing and thinning the structure of a surface-mounted component. Furthermore, the flip chip bonding method is perceived to be advantageous in achieving high speed because the bonding distance is short. In particular, in electronic apparatuses, such as a mobile phone or a Personal Digital Assistant, and a memory card, an IC card, and the like, the number of surface-mounted components manufactured using the flip chip bonding method has been increasing.

In the flip chip bonding method, depending on the types of bumps, how to make electrical connection differs and also the steps in packaging and the materials to be used differ. The types of bumps include a solder bump, a gold bump, a nickel bump, a conductive resin bump, and the like. Hereinafter, (1) a method of bonding via the solder bump and (2) a method of bonding via the bump, such as the gold bump, the nickel bump, or the conductive resin bump are described, respectively.

(1) Method of Bonding Via the Solder Bump

The method of bonding via the solder bump is called C4. C4 is applied in bonding a large-scale logic semiconductor chip having a large number of terminals. The solder bumps are arranged across the circuit surface of a semiconductor chip (area arrangement).

C4 is performed as follows. The oxide film of a solder formed on the surface of a terminal formed in the circuit surface of a semiconductor chip is removed. A flux material that improves the wettability between the solder and a metal constituting a terminal formed in a substrate is applied onto the substrate. The semiconductor chip is pressed against the substrate after aligning the semiconductor chip with the substrate. Due to the adhesion of the flux, the semiconductor chip is temporarily placed on the substrate. Then, the substrate is provided in a reflow furnace and heated up to or beyond a temperature at which the solder melts. The terminal formed in the substrate and the solder are bonded by melting the solder bump. Next, in order to reinforce the bonding between the terminal and the solder, a liquid sealing resin called the underfill material is filled in the gap between the semiconductor chip and the substrate utilizing capillarity. Thereafter, the liquid sealing resin is cured to reinforce the bonding between the terminal and the solder. A method of filling the liquid sealing resin by utilizing capillarity is called a capillary flow method.

In recent years, with an increase in the number of terminals of a semiconductor chip, the pitch between terminals is getting narrower. Hence, the diameter of the solder bump is getting smaller and the distance between the semiconductor chip and the substrate is also getting narrower. Moreover, for the purpose of achieving high reliability of surface-mounted components, the filler content in the underfill material and the viscosity of the underfill material tend to increase. It takes a long time not only to cope with the narrowing pitch and the narrowing gap but to fill the high viscous underfill material using the capillary flow method.

Furthermore, adoption of lead-free solders has increased the reflow temperature. For this reason, upon cooling after reflow, a stress during contraction due to a difference in the thermal expansion coefficients between the substrate and the semiconductor chip increases the risk that the solder breaks. Accordingly, there is a need for protection of the solder also upon cooling after reflow.

In order to solve the problems of the capillary flow method as described above, a method is under study, in which a resin to serve as the underfill material is applied to a substrate in advance before mounting a semiconductor chip on the substrate (a packaging method of preliminarily placing the underfill material on a substrate). This method is called a no-flow underfill method. Studies on resin compositions capable of exhibiting both the flux function and the underfill function by containing a flux component in a resin are under way (e.g., see non-Patent Document 1 and non-Patent Document 2).

(2) Method of Bonding Via the Bump, Such as the Gold Bump, the Nickel Bump, or the Conductive Resin Bump In this case, the number of terminals for connecting between a semiconductor chip and a substrate is on the order of 100 to 500 pins. The bump is often arranged in the outer periphery of the semiconductor chip (peripheral arrangement).

The examples of this bonding method include (A) a method based on a soldered joint between a gold wire bump and a solder formed in a substrate, (B) a method (SBB method) of bonding via a conductive resin formed on the surface of a gold wire bump, called a stud bump bonding, (C) a direct bonding method of bonding by contact by directly pressing a gold wire bump against a substrate, (D) a method of bonding a stud bump that is leveled via conductive particles using an anisotropic conductive adhesive, a gold-plating bump, or a nickel-plating bump to a terminal formed in a substrate, and (E) an ultrasonic method of metallically bonding a bump to a terminal formed in a substrate by applying an ultrasonic wave.

Since a semiconductor chip is bonded to a substrate via an adhesive in the direct bonding method (C) or the method using an anisotropic conductive adhesive (D), the electrical connection and the underfill filling can be performed simultaneously.

On the other hand, as for the other method, the capillary flow method is adopted, in which a solder bonding, a connection by curing a conductive resin, and a solid-phase metal bonding by applying an ultrasonic wave are carried out, respectively and thereafter an underfill material is injected, filled, and cured. Also in the case where the bonding via the bump, such as the gold bump, the nickel bump, or the conductive resin bump is carried out, a packaging method of preliminarily placing an underfill material on a substrate has been studied for the purpose of coping with the narrowing pitch or narrowing gap and also for simplifying the packaging process, as with C4.

The packaging method of preliminarily placing an underfill material on a substrate requires a step of applying a liquid resin to the substrate in advance or a step of applying a film-like resin onto the substrate in advance.

Application of a liquid resin is usually performed using a dispenser. The application from the dispenser is most often controlled by pressure. However, since the discharge amount of the liquid resin will vary in accordance with the viscosity change of the liquid resin even under a constant pressure, it is difficult to keep the amount of application constant. Too small amount of application would cause a non-filled region in which the liquid resin is not filled. If the amount of application is too much, a protruding liquid resin might adhere to a member that crimps a semiconductor chip and a substrate, or might scatter to the adjacent spaces.

On the other hand, in applying a film-like resin to a substrate, since the resin amount can be adjusted by adjusting the thickness and area of the film-like resin, the variation in the resin amount that protrudes during packaging can be reduced.

However, since there is a limit to the accuracy of an apparatus that applies the film-like resin to the substrate, the film-like resin larger than the size of the semiconductor chip needs to be applied to the substrate. Moreover, in bonding wide variety of semiconductor chips having different sizes to the substrate, the film-like resin matching the size of the semiconductor chip needs to be prepared, respectively. Under such technology trends, in recent years, there is a need for a method of efficiently obtaining a singulated semiconductor chip, upon which an adhesive layer matching the size of the semiconductor chip is adhered, and an efficient manufacture method of semiconductor devices using the same.

Then, there are proposed methods capable of solving the complexity in the packaging method of preliminarily placing an underfill material on a substrate and also capable of coping with the narrowing pitch and narrowing gap (e.g., see non-Patent Document 3, Patent Document 1, and Patent Document 2). In these methods, an adhesive as the underfill material is applied to a semiconductor wafer for forming a semiconductor chip and thereafter the semiconductor wafer is singulated to obtain a semiconductor chip upon which the adhesive is adhered. Then, this semiconductor chip is applied to a substrate.

In the method described in non-Patent Document 3, a resin is applied to a semiconductor wafer in advance and thereafter the semiconductor wafer is singulated to obtain a semiconductor chip upon which an underfill material is adhered. In this method, the semiconductor chip in which solder bumps are formed is used. Some of the solder bumps are exposed from the underfill material. The self-alignment of the solder corrects the positional offset between the semiconductor chip and the substrate.

However, in a semiconductor chip in which a bump formed by plating gold, nickel, or the like, or a gold wire bump formed using a gold wire is formed, the bonding is performed by applying an energy, such as by heating or applying an ultrasonic wave, while pressing the semiconductor chip against the substrate using a pressurizing head. For this reason, the self-alignment cannot be used.

On the other hand, in the method described in Patent Document 1, after applying a film-like adhesive to a semiconductor wafer, the semiconductor wafer is singulated by cutting. As a result, a semiconductor chip upon which the film-like adhesive has adhered is obtained. In this method, first, a layered product of semiconductor wafer/film-like adhesive/separator is fabricated. After cutting the layered product, a semiconductor chip upon which the film-like adhesive has adhered is obtained by peeling off the separator.

Patent Document 2 discloses the method, in which with a tape bonded to the semiconductor wafer circuit surface, the rear surface of this semiconductor wafer circuit surface is ground and then this wafer is cut by dicing and is singulated, and then a chip upon which an adhesive layer has adhered is picked up.

Patent Document 1: Japanese Patent No. 2833111
Patent Document 2: Japanese Unexamined Patent Application Publication No. 2006-49482
Non-Patent Document 1: Yoshinobu Homma, "Underfill materials for flip chip", Electronic Materials, Kogyo Chosakai Publishing Co., Ltd., Sep. 1, 2000, vol. 39, No. 9, pp. 36-40
Non-Patent Document 2: Katsuyuki Mizuike, Eiichi Nomura, "Underfill materials for flip chip", Electronic Technology, Nikkan Kogyo Shimbun Ltd., September, 2001, extra edition, pp. 82-83
Non-Patent document 3: Kazutoshi Iida, "Development of materials for bare chip mounting", Electronic Technology, Nikkan Kogyo Shimbun Ltd., September, 2001, extra edition, pp. 84-87

DISCLOSURE OF THE INVENTION

Problems to be Solved by the Invention

Non-Patent Document 3 does not disclose the singulation method. However, if singulation is performed using an ordinary dicing method, the adhesive (underfill material) coated surface will be contaminated and it is thus difficult to obtain an excellent adhesive strength.

Moreover, the method of Patent Document 1 has a problem in that the film-like adhesive and the separator peel off in cutting the layered product, and as a result, the singulated semiconductor chip will scatter or spill out. Moreover, Patent Document 2 does not disclose how to recognize the circuit pattern in the dicing step, and accordingly a singulated semiconductor chip upon which the adhesive layer is adhered cannot be obtained efficiently. Moreover, this method is a problem in that since the dicing step is carried out after curing the adhesive tape by irradiation, the film-like adhesive and the separator peel off in cutting the layered product, and as a result, the singulated semiconductor chip will scatter or spill out.

The present invention has been made in view of the above-described circumstances. It is an object of the present invention to provide a method of manufacturing semiconductor devices, the method being capable of efficiently obtained a singulated semiconductor chip upon which an adhesive is adhered and also capable of excellently bonding a semiconductor chip to a wiring substrate, and provide an adhesive film used in this method of manufacturing semiconductor devices.

Means for Solving the Problems

In order to solve the above-described problems, a method of manufacturing semiconductor devices of the present invention comprises the steps of: preparing a layered product in which a dicing tape, an adhesive layer, and a semiconductor wafer are stacked in this order so that a circuit surface of the semiconductor wafer may face the dicing tape side; recognizing a cutting position by recognizing the circuit pattern in the circuit surface from a surface opposite to the circuit surface of the semiconductor wafer; cutting at least the semiconductor wafer and the adhesive layer in the thickness direction of the layered product after recognizing the cutting position; fabricating a semiconductor chip, upon which the adhesive layer is adhered, by curing the dicing tape after the cutting step, and then peeling off the dicing tape and the adhesive layer; aligning a terminal in the circuit surface of the semiconductor chip, upon which the adhesive layer is adhered, with a wiring of a wiring substrate; and bonding the wiring substrate and the semiconductor chip via the adhesive layer so that the wiring of the wiring substrate and the terminal of the semiconductor chip may be electrically connected to each other.

In the method of manufacturing semiconductor devices of the present invention, since the cutting position is recognized by recognizing the circuit pattern in the circuit surface from the opposite surface (also referred to as the rear surface of the semiconductor wafer) of the circuit surface, and then the semiconductor wafer and the adhesive layer are cut, a pollution-free singulated semiconductor chip can be obtained. Moreover, since the semiconductor wafer is fixed using the dicing tape during cutting and then after cutting, the dicing tape is cured, a singulated semiconductor chip will neither scatter nor spill out to be lost. Therefore, according to the manufacture method of the present invention, a singulated semiconductor chip upon which an adhesive layer is adhered can be efficiently obtained, and also a semiconductor chip and a wiring substrate can be excellently connected to each other. Note that, in the above-described cutting, the entire adhesive layer may be cut so as to cut off the adhesive layers, or the adhesive layer may be cut off so that an end portion on the circuit surface side in the adhesive layer may remain to such an extent that allows the subsequent singulation.

Moreover, preferably, the step of cutting at least the semiconductor wafer and the adhesive layer comprise a first step of cutting a part of the semiconductor wafer, and a second step of cutting a remainder of the semiconductor wafer and the adhesive layer.

This reduces cracks occurring in cutting the layered product, and therefore, disconnection in the circuit surface of the singulated semiconductor chip can be suppressed. As a result, the manufacturing yield of the semiconductor device can be improved.

Moreover, in the step of recognizing the cutting position, the circuit pattern is preferably recognized through the semiconductor wafer. In this case, a scribe line formed on the circuit surface can be usually used, and therefore, there is no need to carry out a processing for recognizing the circuit pattern to the surface opposite to the circuit surface of the semiconductor wafer.

Furthermore, the circuit pattern is preferably recognized using an infrared camera. In this case, the cutting position can be recognized more accurately.

Furthermore, the surface opposite to the circuit surface of the semiconductor wafer is preferably planarized by polishing. In this case, the diffuse reflection of infrared light in the surface opposite to the circuit surface of the semiconductor wafer can be suppressed. Accordingly, the cutting position can be recognized more accurately.

Moreover, in the step of aligning the terminal of the semiconductor chip with the wiring of the wiring substrate, the circuit surface of the semiconductor chip is preferably observed through the adhesive layer adhering to the semiconductor chip. In this case, the circuit surface can be observed even if the bump does not protrude from the adhesive layer.

Furthermore, it is preferable that the circuit surface of the semiconductor chip be observed by emitting light to the adhesive layer from a direction inclined to the normal direction of the surface of the adhesive layer. In this case, the diffuse reflection of light in the surface of the adhesive layer can be suppressed. As a result, the terminal of the semiconductor chip can be aligned with the wiring of the wiring substrate more accurately.

Furthermore, the circuit surface of the semiconductor chip is preferably observed using a camera having a polarizing filter. In this case, an effect from light that diffusely reflected in the surface of the adhesive layer can be reduced. Accordingly, the terminal of the semiconductor chip can be aligned with the wiring of the wiring substrate more accurately.

An adhesive film of the present invention bonds a semiconductor chip and a wiring substrate and electrically connects a wiring of the wiring substrate to a terminal of the semiconductor chip by being cured by pressurization and heating. This adhesive film is used in the method of manufacturing semiconductor devices of the present invention. This adhesive film comprises a resin composition containing a thermoplastic resin, a thermosetting resin, and a curing agent, and a filler. Here, this adhesive film contains 20 to 100 parts by mass of the filler relative to 100 parts by mass of the resin composition. When this adhesive film is heated for 5 to 20 seconds at temperature in the range of 170 to 240° C., the response rate of the adhesive film calculated from the heat value by DSC (differential scanning calorimeter) is no less than 50%.

Here, if the heat value obtained by performing DSC measurement to the adhesive film prior to heating is denoted by A, and the heat value obtained by performing DSC measurement to the adhesive film after heating is denoted by B, then the response rate X (unit: %) of the adhesive film is calculated by Equation (1) below.

$$X=(A-B)/A\times 100 \qquad (1)$$

By using the adhesive film of the present invention, the method of manufacturing semiconductor devices of the present invention can be carried out suitably.

Effects of the Invention

According to the present invention, the cutting position is recognized by recognizing a circuit pattern in the circuit surface from the surface opposite to the circuit surface of a semiconductor wafer, and therefore, a pollution-free singulated semiconductor chip can be obtained. Moreover, since the wafer is fixed using the dicing tape, the singulated semiconductor chip will neither scatter nor spill out to be lost and thus a method of manufacturing semiconductor devices and the adhesive film used in this method of manufacturing semiconductor devices are provided efficiently.

Figure 1:
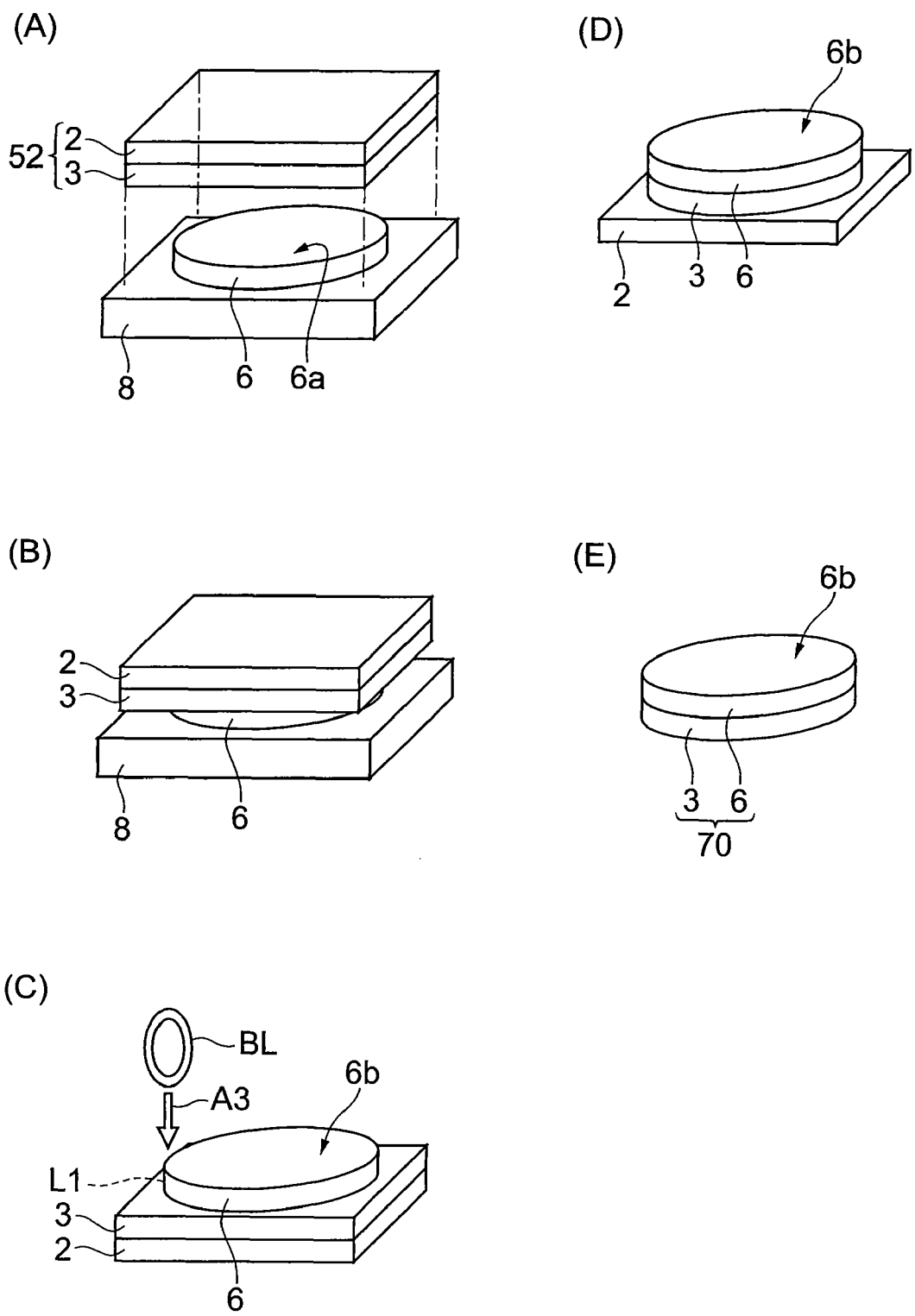
FIG. 1 is a process chart schematically showing a method of manufacturing semiconductor devices according to a first embodiment.
Figure 2:
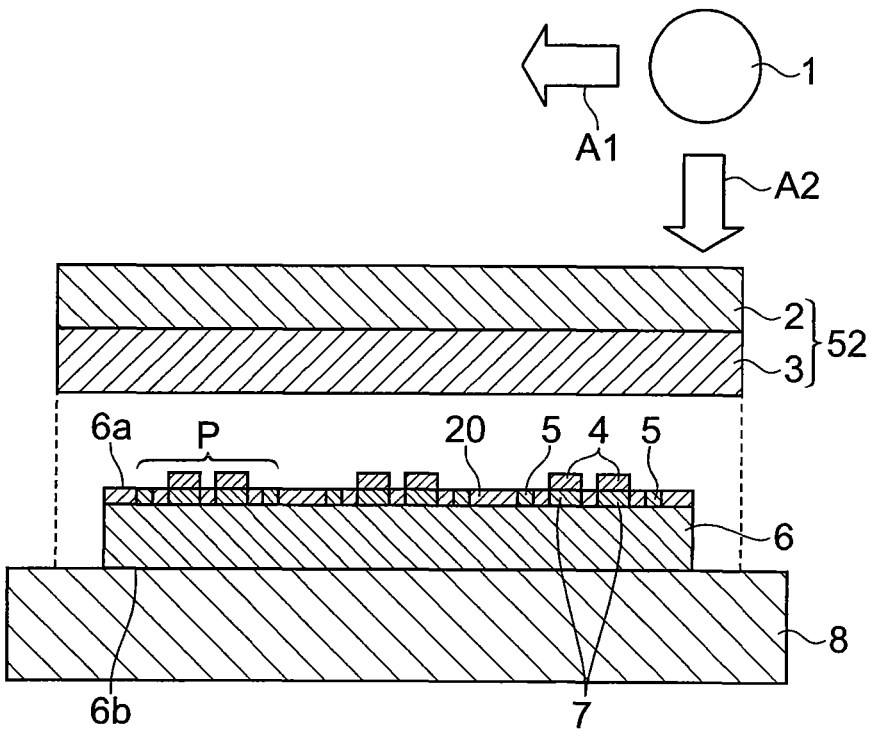
FIG. 2 is a process chart schematically showing the method of manufacturing semiconductor devices according to the first embodiment.
Figure 2:
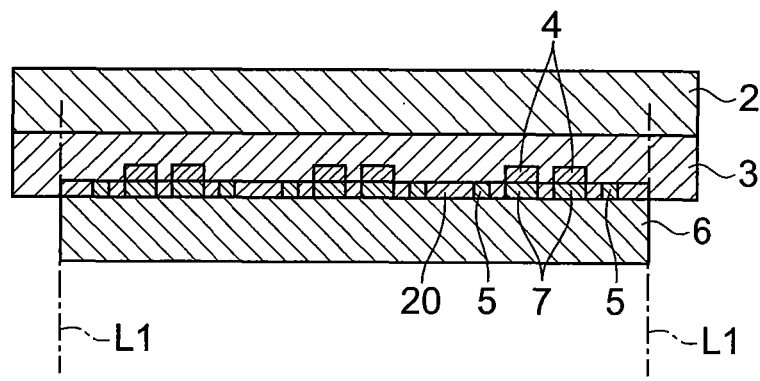
Figure 2:
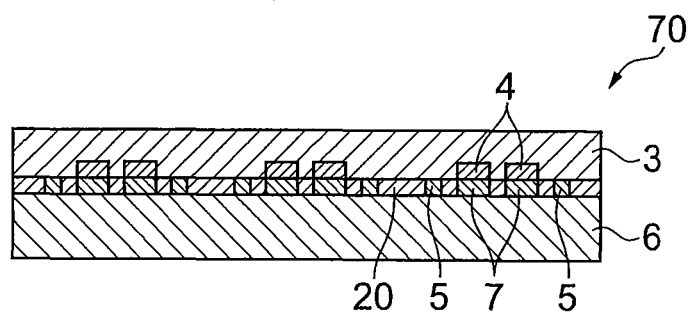
Figure 3:
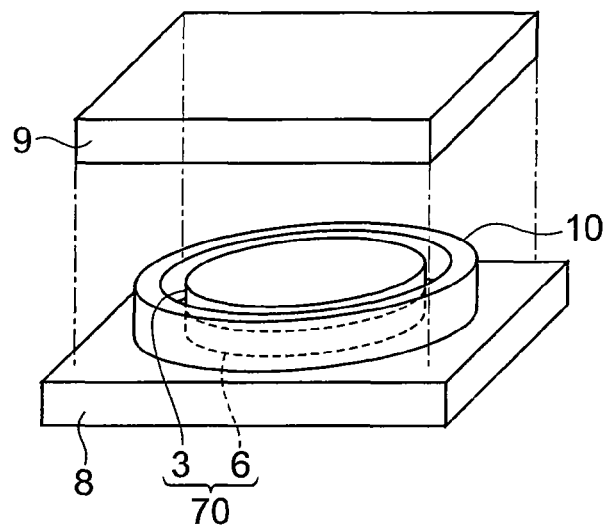
FIG. 3 is a process chart schematically showing the method of manufacturing semiconductor devices according to the first embodiment.
Figure 3:
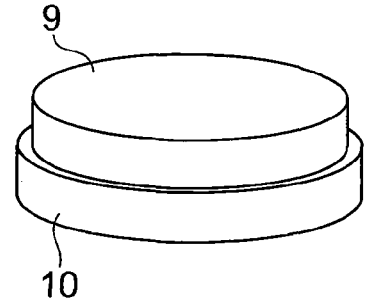
Figure 3:
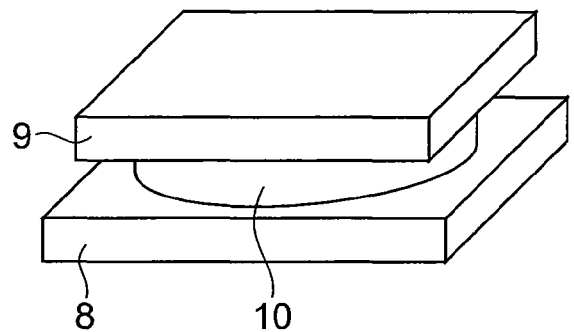
Figure 3:
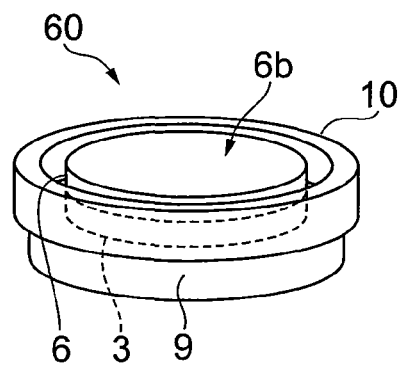
Figure 3:
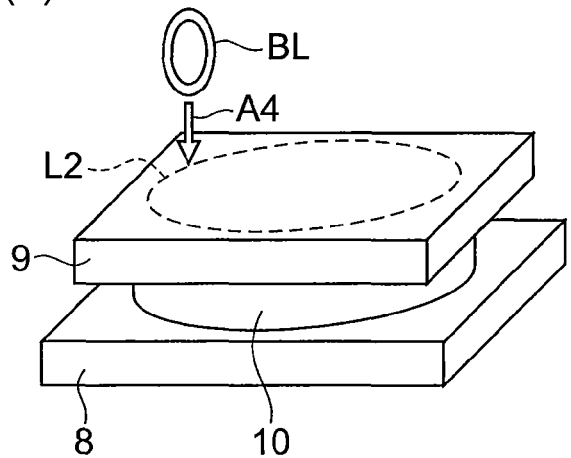
Figure 4:
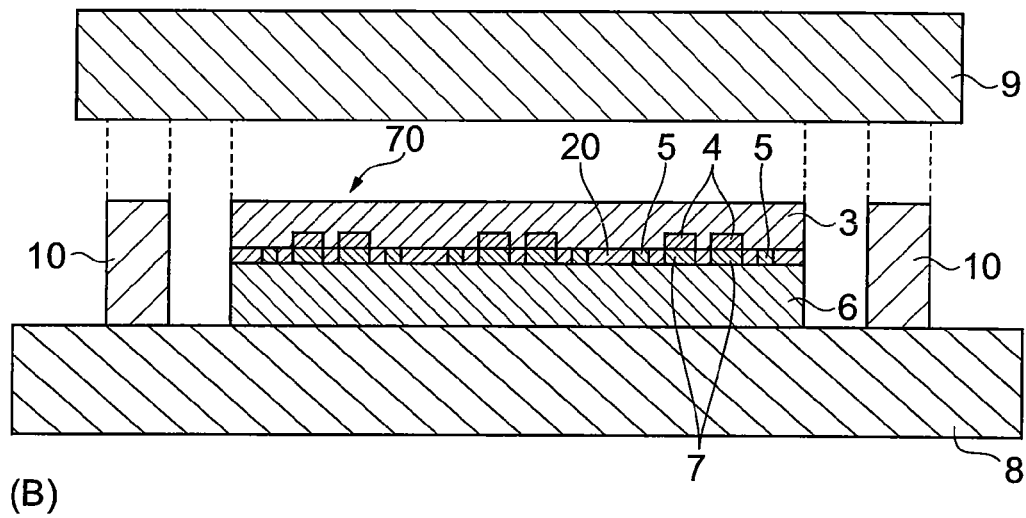
FIG. 4 is a process chart schematically showing the method of manufacturing semiconductor devices according to the first embodiment.
Figure 4:
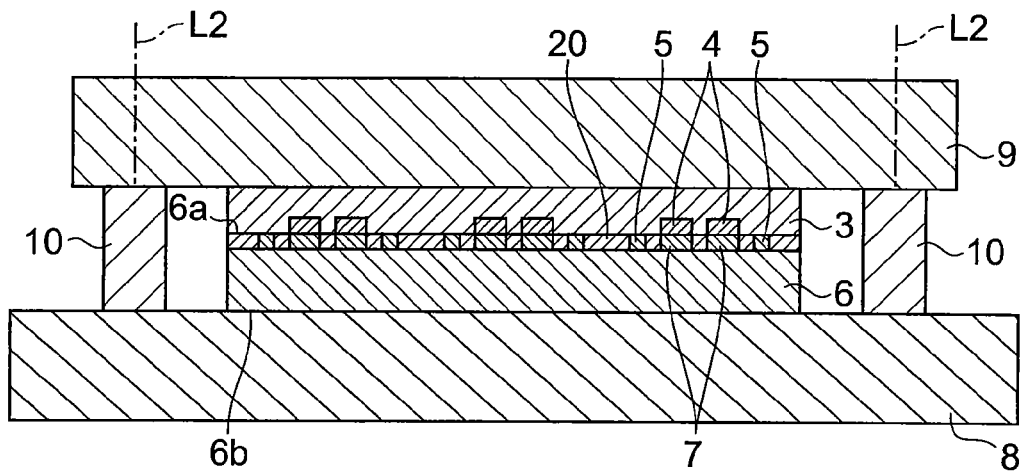
Figure 4:
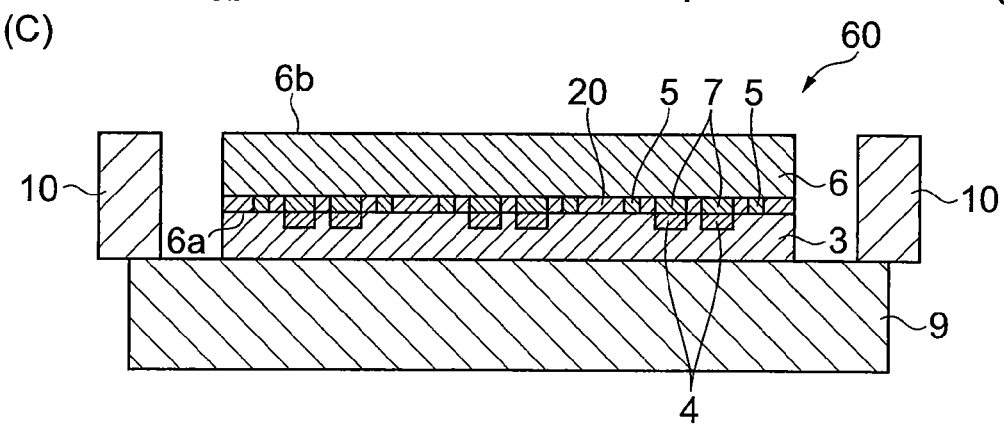
Figure 5:
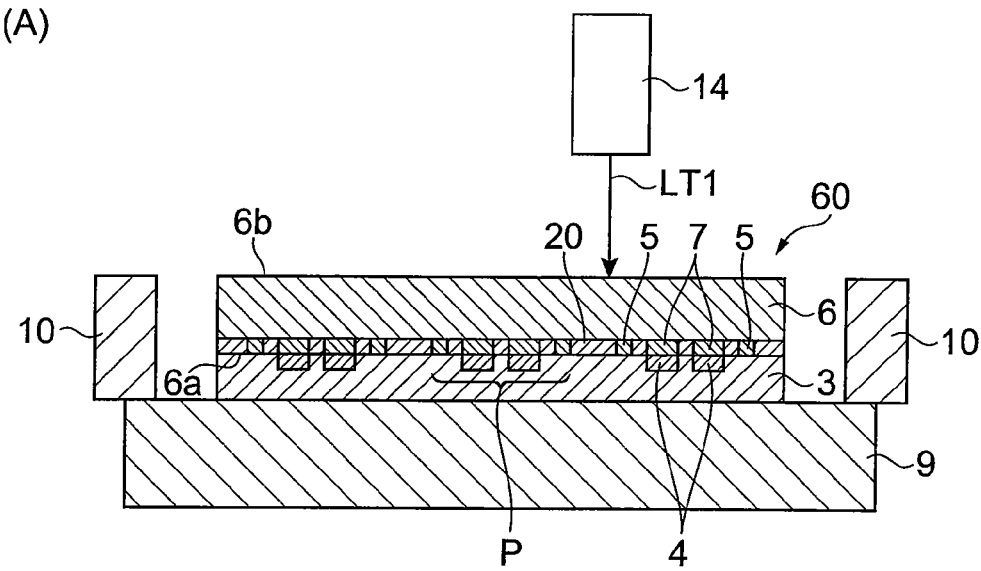
FIG. 5 is a process chart schematically showing the method of manufacturing semiconductor devices according to the first embodiment.
Figure 5:
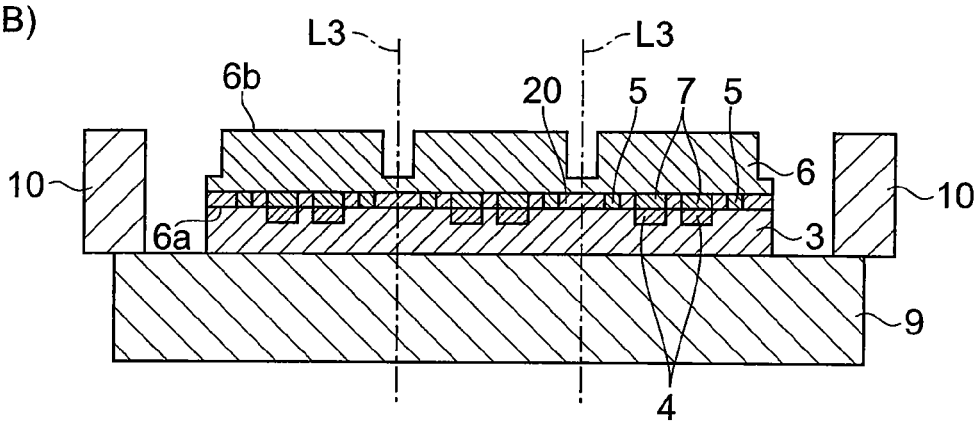
Figure 5:
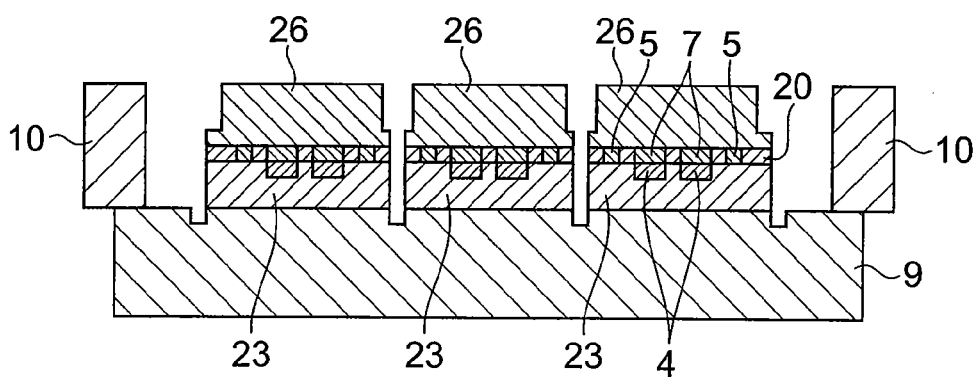
Figure 6:
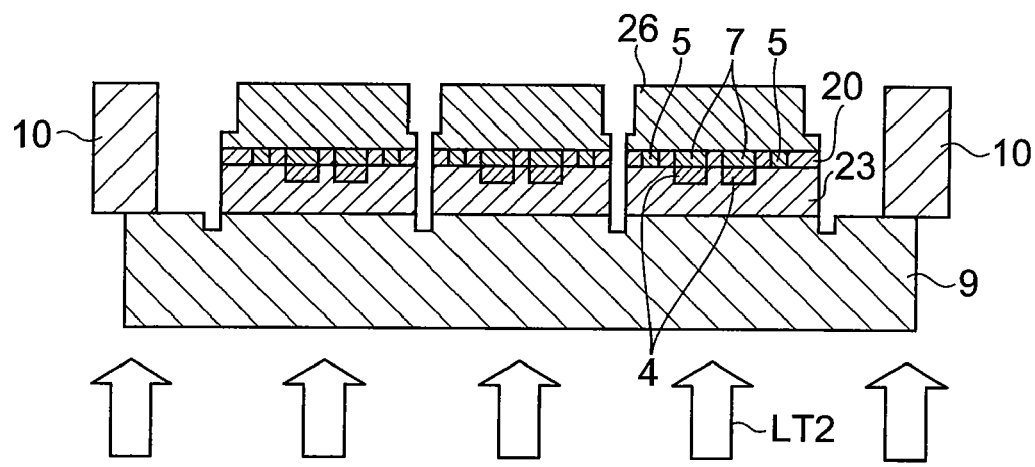
FIG. 6 is a process chart schematically showing the method of manufacturing semiconductor devices according to the first embodiment.
Figure 6:
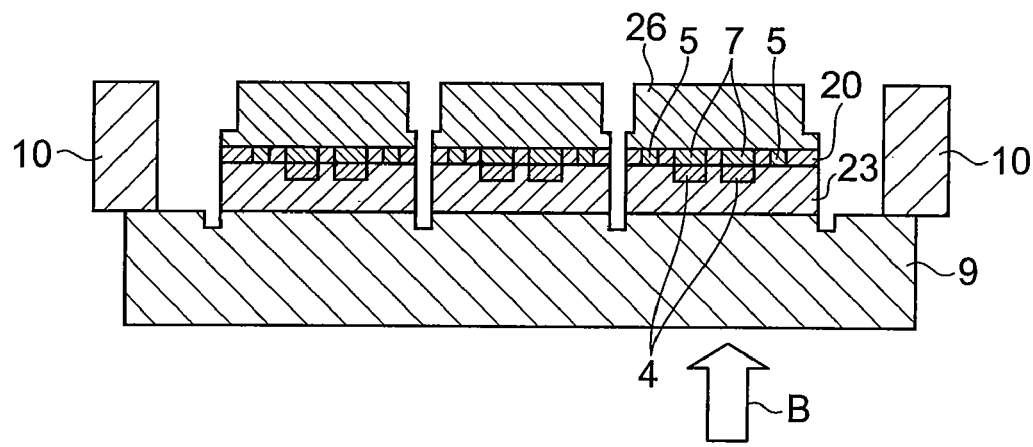
Figure 6:
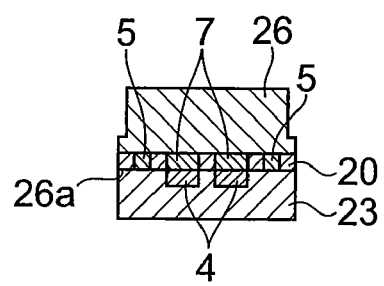

DESCRIPTION OF THE REFERENCE SYMBOLS 3, 23 . . . adhesive layer (adhesive film), 6 . . . semiconductor wafer, 6a, 26 . . . circuit surface, 6b . . . rear surface (surface opposite to circuit surface), 9 . . . dicing tape, 12 . . . wiring, 14 . . . infrared camera, 15 . . . camera, 15a . . . polarizing filter, 23a . . . surface of adhesive layer, 26 . . . semiconductor chip, 40 . . . wiring substrate, 50 . . . semiconductor device, 60 . . . layered product, LT3 . . . light, P . . . circuit pattern

BEST MODES FOR CARRYING OUT THE INVENTION

Hereinafter, embodiments of the present invention will be described in detail with reference to the accompanying drawings. Note that, in the description of the drawings, the same reference numeral is used for the same or equivalent element to omit the duplicated description.

First Embodiment

FIG. 1 to FIG. 8 are process charts schematically showing a method of manufacturing semiconductor devices according to a first embodiment.

(Layered Product Preparation Step)

First, as shown in FIG. 1(A) and FIG. 2(A), for example, a semiconductor wafer 6 such as a silicon wafer is placed on a chuck 8. An electrode pad 7 and an alignment mark 5 are formed in a circuit surface 6a of the semiconductor wafer 6. An insulating film 20 is filled between the electrode pad 7 and the alignment mark 5. The surfaces of the electrode pad 7, the alignment mark 5, and the insulating film 20 are planarized. A projection electrode 4 (terminal) projecting from the surface of the insulating film 20 is provided on the electrode pad 7. The electrode pad 7, the alignment mark 5, and the projection electrode 4 form a circuit pattern P. A rear surface 6b (surface opposite to the circuit surface) of the semiconductor wafer 6 is in contact with the chuck 8.

On the other hand, an adhesive sheet 52 comprising a separator 2 and an adhesive layer 3 provided on the separator 2 is prepared. The arrangement is made so that the adhesive layer 3 of the adhesive sheet 52 may face the circuit surface 6a of the semiconductor wafer 6, and then the adhesive layer 3 is laminated onto the circuit surface 6a using a roller 1 such as a pressurizing roller. The roller 1 pressurizes the adhesive sheet 52 in a direction A2 perpendicular to the circuit surface 6a while moving in a direction A1 parallel to the circuit surface 6a. The adhesive layer 3 of the adhesive sheet 52 is pressed against the circuit surface 6a of the semiconductor wafer 6 by the roller 1 (see FIG. 1(B)).

Examples of a laminating machine include the one having the roller 1 placed on the upper and lower sides of the adhesive sheet 52, respectively, and the one that presses the adhesive sheet 52 against the semiconductor wafer 6 under vacuum conditions. The adhesive sheet 52 is preferably heated in laminating. Accordingly, the adhesive layer 3 can be sufficiently adhered to the semiconductor wafer 6, and the periphery of the projection electrode 4 can be sufficiently filled without space. The heating temperature is controlled to such extent that the adhesive layer 3 is softened but not cured. If the adhesive layer 3 comprises, for example, an epoxy resin, an acrylate copolymer whose softening temperature is 40° C., and a latent curing agent for epoxy resins whose threshold reaction temperature is 100° C., then the heating temperature is set to 80° C., for example.

Although the electrode pad 7 is composed of, for example, an aluminum film formed using a sputtering method, it may comprise silicon, copper, titanium, or the like as the minor constituent, for example. The alignment mark 5 is formed simultaneously with the electrode pad 7, for example. The alignment mark 5 is composed of aluminum, for example.

A gold film may be formed on the surface of the alignment mark 5. In this case, variations in the flatness of the surface of the alignment mark 5 can be reduced. Furthermore, for example, if the alignment mark 5 is composed of aluminum, then by forming a gold film thereon, the variations in reflected light due to the oxidation state of aluminum can be reduced. The pattern shape of the alignment mark 5 is a cross pattern, for example, but not be limited thereto, and may be a circular pattern or an L-shaped pattern. The alignment mark 5 is usually arranged at the four corners of the semiconductor chip 26 obtained by dicing the semiconductor wafer 6. However, the place of the alignment mark 5 is not limited in particular as long as it is a place where the accuracy of alignment can be secured.

The projection electrode 4 is a gold bump formed by gold plating, for example. The projection electrode 4 may be a gold stud bump that is formed using a gold wire, a metal ball that is fixed onto the electrode pad 7 by thermocompression bonding in combination with an ultrasonic wave, as needed, a bump that is formed by plating or vapor deposition, or the like. The projection electrode 4 does not need to be composed of a single metal and may comprise a plurality of metals. The projection electrode 4 may comprise gold, silver, copper, nickel, indium, palladium, tin, bismuth, or the like. Moreover, the projection electrode 4 may be a layered product comprising a plurality of metal layers.

The examples of the insulating film 20 include a film composed of silicon nitride. The insulating film 20 may be composed of polyimide. The insulating film 20 has an opening provided on the electrode pad 7. Although the insulating film 20 may be formed so as to cover the alignment mark 5, it may have an opening provided on the alignment mark 5. In this case, the alignment mark 5 is not covered with the insulating film 20, and therefore, the accuracy of alignment using the alignment mark 5 will be improved.

A scheduled cutting line called a scribe line for dicing the semiconductor wafer 6 is formed on the circuit surface 6a of the semiconductor wafer 6. The scheduled cutting line is arranged in a grid pattern, for example. A mark for alignment in cutting may be provided in the scheduled cutting line.

The examples of the separator 2 include a PET base material whose surface is mold release treated with silicone or the like. The adhesive layer 3 is formed by drying after applying an adhesive composition to the separator 2, for example. The adhesive layer 3 is solid at room temperature, for example.

The adhesive layer 3 comprises a thermosetting resin. The thermosetting resin is cured by being three-dimensionally cross-linked with heat.

Examples of the above-described thermosetting resin includes an epoxy resin, a bismaleimide resin, a triazine resin, a polyimide resin, a polyamide resin, a cyanoacrylate resin, a phenol resin, an unsaturated polyester resin, a melamine resin, a urea resin, a polyurthane resin, a polyisocyanate resin, a furan resin, a resorcinol resin, a xylene resin, a benzoguanamine resin, a diallyl phthalate resin, a silicone resin, a polyvinyl butyral resin, a siloxane modified epoxy resin, a siloxane modified polyamide imide resin, and an acrylate resin. These can be used alone or as a mixture of two or more types.

The adhesive layer 3 may comprise a curing agent for facilitating the curing response. Te adhesive layer 3 preferably comprises a latent curing agent in order to have both high reactivity and preservation stability.

The adhesive layer 3 may comprise a thermoplastic resin. Examples of the thermoplastic resin include a polyester resin, a polyether resin, a polyamide resin, a polyamide imide resin, a polyimide resin, a polyarylate resin, a polyvinyl butyral resin, a polyurthane resin, a phenoxy resin, a polyacrylate resin, polybutadiene, an acrylonitrile butadiene copolymer (NBR), an acrylonitrile-butadiene rubber styrene resin (ABS), a styrene butadiene copolymer (SBR), and an acrylate copolymer. These can be used alone or as a combination of two or more types. Among these, in order to secure the stickiness to the semiconductor wafer 6, a thermoplastic resin having a softening point at near room temperature is preferable, and an acrylate copolymer containing glycidyl methacrylate or the like as the raw material is preferable.

A filler (inorganic microparticle) for providing a low coefficient of linear expansion may be added in the adhesive layer 3. As such a filler, the one having crystallizability or the one having amorphous nature may be used. The thermal deformation is suppressed if the coefficient of linear expansion of the adhesive layer 3 after curing is small. Thus, the electrical connection between the projection electrode of a semiconductor chip and the wiring of a wiring substrate can be maintained, and therefore, the reliability of a semiconductor device manufactured by bonding the semiconductor chip to the wiring substrate can be improved.

The adhesive layer 3 may comprise an additive such as a coupling agent. Thereby, the adhesiveness between the semiconductor chip and the wiring substrate can be improved.

Conductive particles may be dispersed in the adhesive layer 3. In this case, an adverse effect due to variations in the height of the projection electrode of the semiconductor chip can be reduced. Moreover, even in the case where the wiring substrate is difficult to deform upon compression, as with a glass substrate, the connection can be maintained. Furthermore, the adhesive layer 3 may be an anisotropic conductive adhesive layer.

The thickness of the adhesive layer 3 is preferably a thickness that allows the adhesive layer 3 to sufficiently fill between the semiconductor chip and the wiring substrates. Usually, if the thickness of the adhesive layer 3 is a thickness corresponding to a sum of the height of the projection electrode and the height of the wiring of the wiring substrate, the adhesive layer 3 can fill between the semiconductor chip and the wiring substrate.

Next, as shown in FIG. 1(C) and FIG. 2(B), by moving a blade BL in a direction A3 and pressing the blade BL against the rear surface 6b of the semiconductor wafer 6, the adhesive layer 3 is cut along an outer periphery L1 of the semiconductor wafer 6 (half cutting, see FIG. 1(D)). Note that both the adhesive layer 3 and the separator 2 may be cut (full cutting). Thereafter, by peeling/removing the separator 2 from the adhesive layer 3, a layered product 70 comprising the semiconductor wafer 6 and the adhesive layer 3 is formed as shown in FIG. 1(E) and FIG. 2(C).

Next, as shown in FIG. 3(A) and FIG. 4(A), a dicing frame 10 and the layered product 70 are placed on the chuck 8. The layered product 70 is placed so that the semiconductor wafer 6 may be located between the adhesive layer 3 and the chuck 8. The dicing frame 10 surrounds the periphery of the layered product 70. Thereafter, the adhesive layer 3 and a dicing tape 9 are oppositely arranged, and then the dicing tape 9 is laminated onto the dicing frame 10 and the layered product 70 using the roller 1 (see FIG. 3(B)).

For example, the dicing tape 9 has an adhesive layer, which is cured by UV irradiation, on the surface. The curing of the adhesive layer reduces the adhesion of the adhesive layer. The dicing tape 9 may have an adhesive layer, whose adhesion will not vary, on the surface.

Next, as shown in FIG. 3(C) and FIG. 4(B), the dicing tape 9 is cut along a scheduled cutting line L2 along the dicing frame 10 (full cutting, see FIG. 3(D)). Accordingly, as shown in FIG. 3(E) and FIG. 4(C), a layered product 60 is obtained, in which the dicing tape 9, the adhesive layer 3, and the semiconductor wafer 6 are stacked in this order so that the circuit surface 6a of the semiconductor wafer 6 may face the dicing tape 9 side.

(Step of Recognizing the Cutting Position)

Next, as shown in FIG. 5(A), the cutting position is recognized by recognizing the circuit pattern P in the circuit surface 6a from the rear surface 6b of the semiconductor wafer 6. In this case, in the rear surface 6b of the semiconductor wafer 6, a line may be formed in the cutting position. However, if the observation is made by transmission, there is no need to perform a special processing for recognizing the circuit pattern P, which is therefore preferable. In particular, the circuit pattern P is preferably recognized through the semiconductor wafer 6 using an infrared camera (IR camera) 14. Thereby, the alignment of the layered product 60 can be made accurately. If the semiconductor wafer 6 is composed of silicon and the electrode pad 7 and the alignment mark 5 of the circuit pattern P are composed of aluminum, infrared light LT1 emitted from the infrared camera 14 transmits through the semiconductor wafer 6 but does not transmit through the circuit pattern P.

Moreover, the rear surface 6b of the semiconductor wafer 6 is preferably planarized by polishing, and is more preferably mirror finished. If the rear surface 6b is polished, diffuse reflection of the infrared light LT1 in the rear surface 6b of the semiconductor wafer 6 can be suppressed. Accordingly, the alignment of the layered product 60 can be performed accurately. For example, the rear surface 6b of the semiconductor wafer 6 can be planarized with a back grinder or the like. If the rear surface 6b of the semiconductor wafer 6 has few flaws or few irregularities, the infrared light LT1 is unlikely to diffusely reflect, and therefore a clear transmission image by the infrared light LT1 can be obtained.

(Dicing Step)

Next, as shown in FIG. 5(B) and FIG. 5(C), the semiconductor wafer 6 and the adhesive layer 3 are diced (cut) in the thickness direction of the layered product 60 along a scheduled cutting line L3, such as a scribe line, for example. In the dicing step, for example, a dicing saw with the infrared camera 14 shown in FIG. 5(A) is used. In the dicing step, as shown in FIG. 5(B), it is preferable that a first step of cutting a part of the semiconductor wafers 6 and a second step of cutting the remainder of the semiconductor wafer 6 and the adhesive layer 3 as shown in FIG. 5(C) be performed. Since this can reduce cracks occurring in cutting the layered product 60, disconnection in the circuit surface 6a of the semiconductor wafer 6 can be suppressed. As a result, the manufacturing yield of the semiconductor device can be improved.

If a crack grows from the cutting plane to the direction parallel to the circuit surface 6a of the semiconductor wafer 6, a disconnection failure might occur in the circuit surface 6a. However, by cutting in a stepwise fashion, abrupt growth of the crack can be suppressed.

Moreover, it is preferable that in the first step the cutting be performed using a first blade and in the second step the cutting be performed using a second blade thinner than the first blade. In this case, since the width of a groove formed by cutting in the second step becomes smaller than the width of a groove formed by cutting in the first step, the growth of a crack can be suppressed further. If the thickness of the blade used in cutting is thinned, the width of a groove can be reduced.

Note that, if the circuit surface of the semiconductor wafer is arranged so as to face the blade (or infrared camera) side, as in the ordinary dicing step, chips will stick to the adhesive layer. In this case, the connection reliability between the semiconductor chip and the wiring substrate will deteriorate. On the other hand, in this embodiment, the semiconductor wafer 6, the adhesive layer 3, and the dicing tape 9 are stacked in this order from the blade side, and therefore, the adhesion of the chips to the adhesive layer 3 can be suppressed. Note that, the side face (cutting plane) of the adhesive layer 3 is pushed out to the outside of the circuit surface of the semiconductor chip in bonding the semiconductor chip to the wiring substrate, and therefore, no deterioration of the connection reliability will occur.

(Peeling Step)

Next, as shown in FIG. 6(A) to FIG. 6(C), the semiconductor chip 26 upon which the adhesive layer 23 has stuck is fabricated by peeling the dicing tape 9 from the adhesive layer 3.

First, as shown in FIG. 6(A), the adhesive layer of the dicing tape 9 is cured by irradiating the dicing tape 9 with UV light LT2. This reduces the adhesion of the dicing tape 9.

Subsequently, as shown in FIG. 6(B), the dicing tape 9 is pushed up by pressing the dicing tape 9 in a direction B perpendicular to the plane in which the dicing tape 9 extends. Accordingly, as shown in FIG. 6(C), the semiconductor chip 26 upon which the adhesive layer 23 has stuck is pushed out and the semiconductor chip 26 can be picked up. Then, a singulated semiconductor chip 26 upon which the adhesive layer 23 is stuck is obtained.

(Step of Aligning the Semiconductor Chip With the Wiring Substrate)

Figure 7:
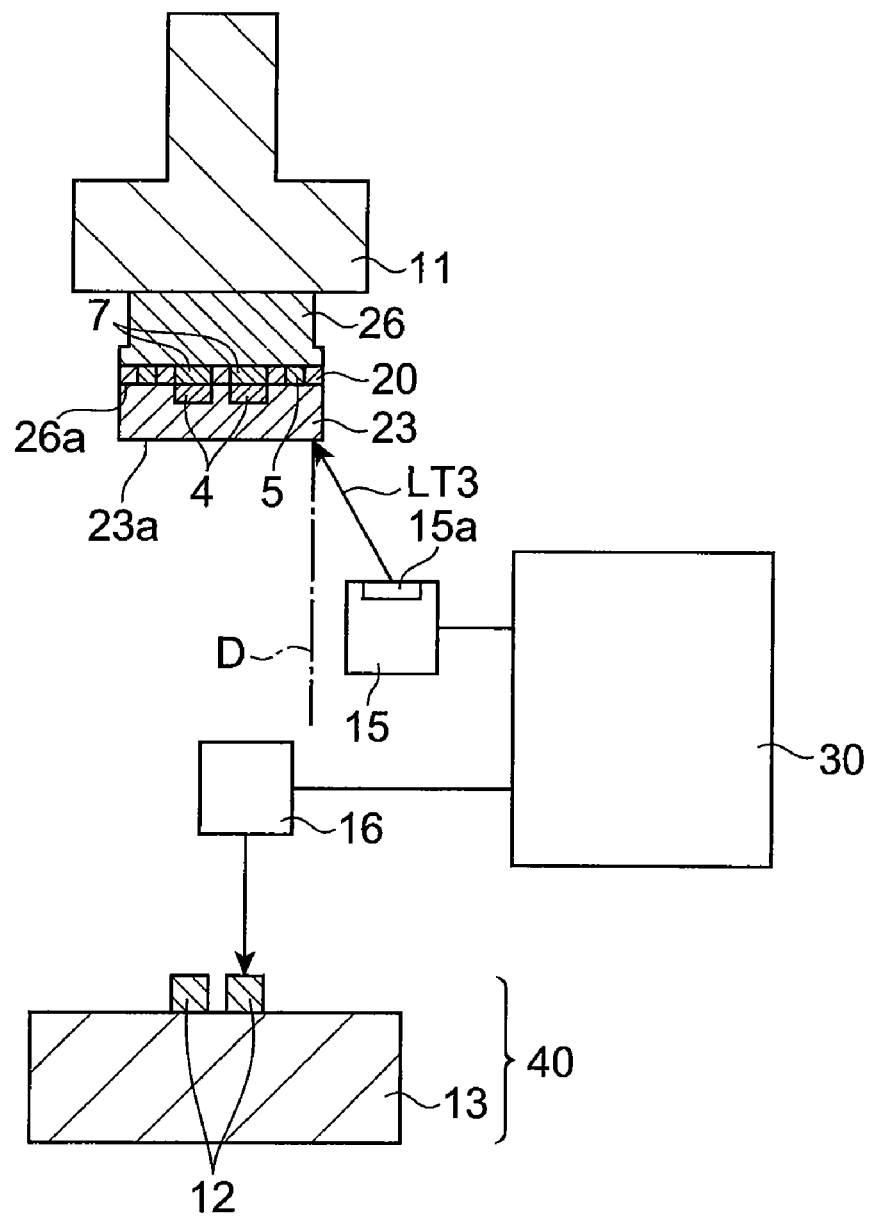
FIG. 7 is a process chart schematically showing the method of manufacturing semiconductor devices according to the first embodiment.
Figure 8:
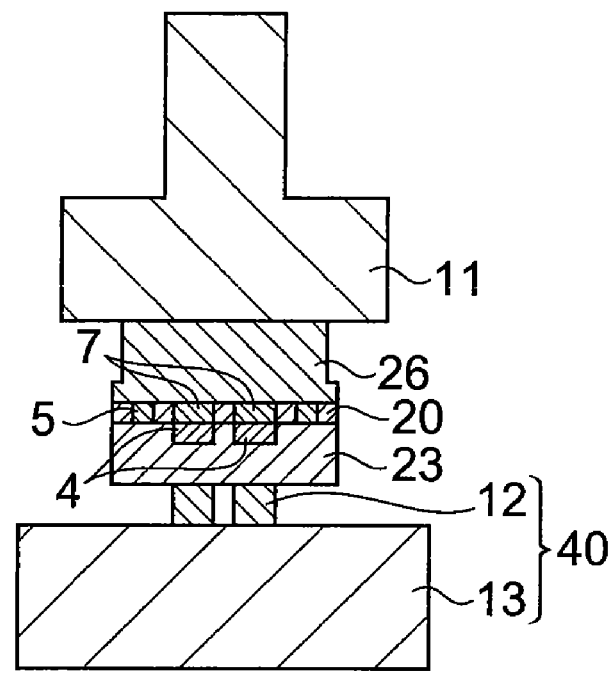
FIG. 8 is a process chart schematically showing the method of manufacturing semiconductor devices according to the first embodiment.
Figure 8:
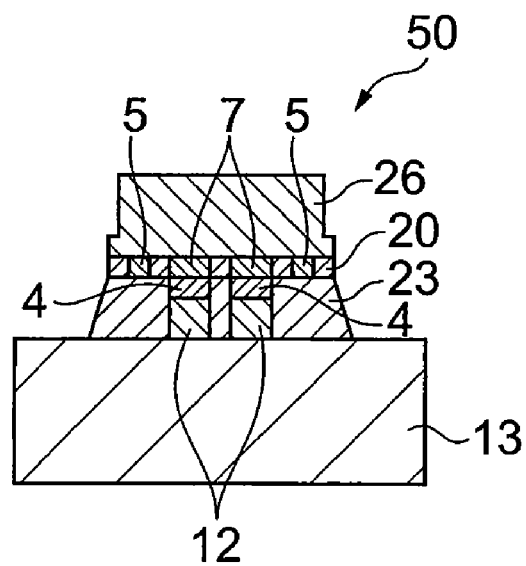

Next, as shown in FIG. 7, the projection electrode 4 (terminal) in the circuit surface 26a of the semiconductor chip 26 upon which the adhesive layer 23 has stuck is aligned with a wiring 12 of a wiring substrate 40. The wiring substrate 40 comprises a substrate 13 and the wiring 12 provided on the substrate 13. The alignment is performed using a flip chip bonder, for example.

First, on an adsorption/heating head 11 of the flip chip bonder, the semiconductor chip 26 upon which the adhesive layer 23 has stuck is arranged and placed so that the semiconductor chip 26 may face the adsorption/heating head 11 side. Subsequently, the alignment mark 5 formed on the circuit surface 26a of the semiconductor chip 26 is recognized using a camera 15. In the case where the alignment mark 5 is covered with the adhesive layer 23, it is preferable that the circuit surface 26a of the semiconductor chip 26 be observed through the adhesive layer 23 adhering to the semiconductor chip 26. In this case, there is no need to perform a processing to the semiconductor chip 26 in order to observe the circuit surface 26a of the semiconductor chip 26. Since the alignment mark 5 can be recognized by observing the circuit surface 26a, the position of the semiconductor chip 26 can be determined.

Moreover, the circuit surface 26a of the semiconductor chip 26 may be observed by irradiating the adhesive layer 23 with light LT3 from a direction inclined relative to the normal direction D of the surface 23a of the adhesive layer 23. In this case, diffuse reflection of the light LT3 in the surface 23a of the adhesive layer 23 can be suppressed. Accordingly, the projection electrode 4 of the semiconductor chip 26 can be aligned with the wiring 12 of the wiring substrate 40 accurately. Moreover, the circuit surface 26a of the semiconductor chip 26 may be observed while blocking the reflected light from the surface 23a of the adhesive layer 23 using the camera 15 having a polarizing filter 15a.

On the other hand, the alignment mark provided in the wiring substrate 40 is recognized using a camera 16. Thereby, the position of the wiring substrate 40 can be determined. Image signals from the camera 15 and the camera 16 are input to a computer 30. The computer 30 can control the relative position between the semiconductor chip 26 and the wiring substrate 40 so that the projection electrode 4 of the semiconductor chip 26 may be aligned with the wiring 12 of the wiring substrate 40 accurately.

(Bonding Step)

Next, as shown in FIG. 8(A) and FIG. 8(B), the wiring substrate 40 and the semiconductor chip 26 are bonded via the adhesive layer 23 so that the wiring 12 of the wiring substrate 40 and the projection electrode 4 of the semiconductor chip 26 may be electrically connected to each other. Thus, a semiconductor device 50 shown in FIG. 8(B) is manufactured. Specifically, for example, the wiring substrate 40 and the semiconductor chip 26 are thermocompression bonded. Preferably, thermocompression bonding be carried out so that the response rate of the adhesive layer 23 calculated from the heat value by DSC (differential scanning calorimeter) after thermocompression bonding may become no less than 50%. Accordingly, the wiring 12 and the projection electrode 4 can be electrically and mechanically connected to each other. Furthermore, the connection between the wiring 12 and the projection electrode 4 can be maintained also during cooling contraction after bonding.

The wiring 12 and the projection electrode 4 may mechanically contact to each other or may be solid-state welded by application of an ultrasonic wave. Moreover, by forming an alloy layer on the surface of the wiring 12, the alloy layer and the projection electrode 4 may be alloyed. Furthermore, the wiring 12 and the projection electrode 4 may be connected via conductive particles.

In the method of manufacturing semiconductor devices of this embodiment, the cutting position is recognized by recognizing the circuit pattern P in the circuit surface 26a from the rear surface 6b of the semiconductor wafer 6, and then the semiconductor wafer 6 and the adhesive layer 3 are cut. Accordingly, pollution-free singulated semiconductor chips can be obtained. Moreover, the semiconductor wafer 6 is fixed using the dicing tape 9 during cutting, and after cutting, the dicing tape 9 is cured. Accordingly, the singulated semiconductor chip 26 will neither scatter nor spill out to be lost. Therefore, according to the manufacture method of this embodiment, the singulated semiconductor chip 26 upon which the adhesive layer is adhered can be efficiently obtained, and also the semiconductor chip 26 and the wiring substrate 40 can be excellently connected to each other. As a result, the manufacturing yield of the semiconductor device 50 can be improved.

Moreover, the size of the semiconductor chip 26 and the size of the adhesive layer 23 are substantially the same, and therefore, when pressing the adhesive layer 23 in the bonding step, the amount of the adhesive layer 23 protruding to the outside will decrease. Accordingly, in the case where a plurality of semiconductor chips 26 are bonded to the wiring substrate 40, the distance between the adjacent semiconductor chips 26 can be designed to be short, and therefore high density packaging is possible. Moreover, the amount of the sealing resin for sealing the semiconductor chip 26 can be also reduced. Furthermore, since temporary crimping is not required, the semiconductor chip 26 can be mounted in an inserting manner even after mounting other components that are different from the semiconductor chip 26.

Moreover, the adhesive layer 3 can be used as an adhesive film of this embodiment. The adhesive film of this embodiment bonds the semiconductor chip 26 and the wiring substrate 40 by being cured by pressurization and heating, and also electrically connects the wiring 12 of the wiring substrate 40 to the projection electrode 4 of the semiconductor chip 26. The adhesive film is used in the method of manufacturing semiconductor devices of this embodiment. The adhesive film comprises a resin composition containing a thermoplastic resin, a thermosetting resin, and a curing agent, and a filler. The adhesive film contains 20 to 100 parts by mass of the filler relative to 100 parts by mass of the resin composition. When the adhesive film is heated for 5 to 20 seconds at temperature in the range of 170 to 240° C., the response rate of the adhesive film calculated from the heat value by DSC (differential scanning calorimeter) is no less than 50%.

By using the adhesive film of this embodiment, the method of manufacturing semiconductor devices of this embodiment can be implemented suitably. Moreover, since the mechanical and electrical connection between the semiconductor chip 26 and the wiring substrate 40 can be maintained, the semiconductor device 50 having high connection reliability can be manufactured.

Second Embodiment

Figure 9:
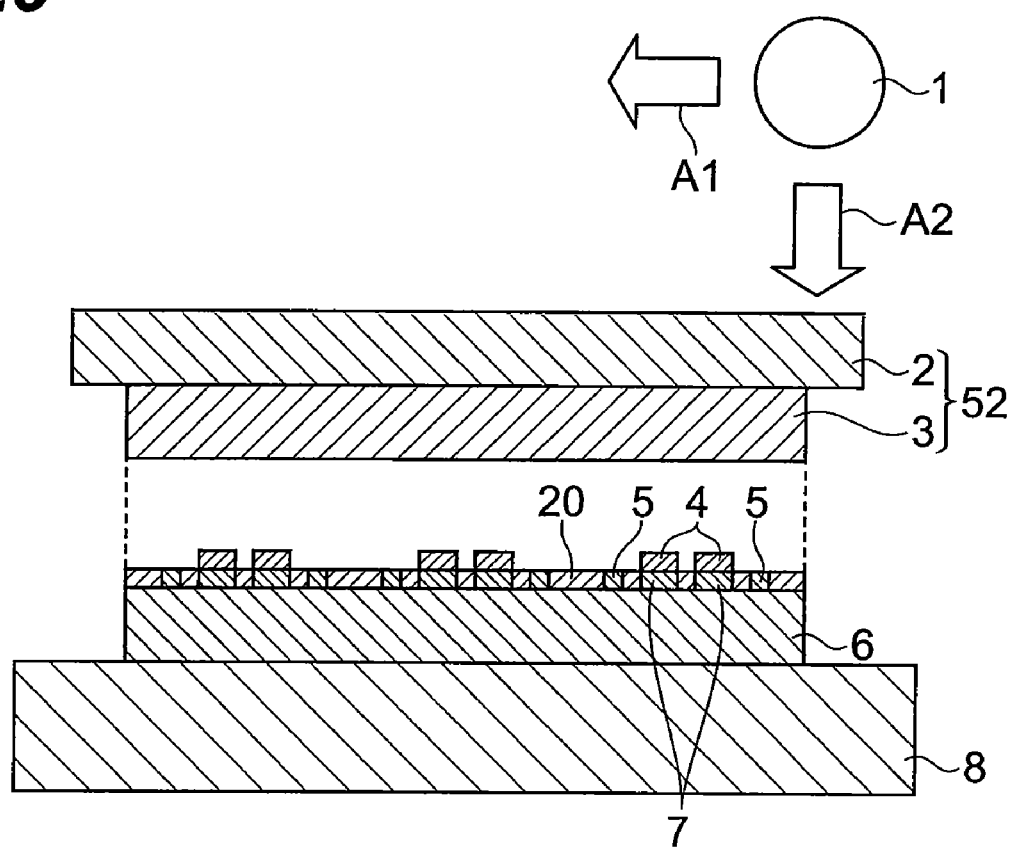
FIG. 9 is a process chart schematically showing a step in a method of manufacturing semiconductor devices according to a second embodiment.

FIG. 9 is a process chart schematically showing a step in a method of manufacturing semiconductor devices according to a second embodiment. In this embodiment, the adhesive layer 3 of the adhesive sheet 52, which is processed in advance so that the size of the adhesive layer 3 may become substantially the same as the size of the semiconductor wafer 6, is laminated onto the circuit surface 6a. Thereafter, by peeling/removing the separator 2 from the adhesive layer 3, the layered product 70 comprising the semiconductor wafer 6 and the adhesive layer 3 is formed as shown in FIG. 2(C). Thereafter, as in the first embodiment, the semiconductor device 50 shown in FIG. 8(B) can be manufactured. In this embodiment, the same operational effect as that of the first embodiment is obtained. Furthermore, in the case of this embodiment, the cutting step after laminating the adhesive layer 3 onto the semiconductor wafer 6 is not required, thereby increasing the operating efficiency.

In this embodiment, in laminating the adhesive layer 3 of the adhesive sheet 52 onto the circuit surface 6a, the adhesive layer 3 is aligned with the semiconductor wafer 6. Accordingly, the separator 2 is preferably transparent.

Third Embodiment

Figure 10:
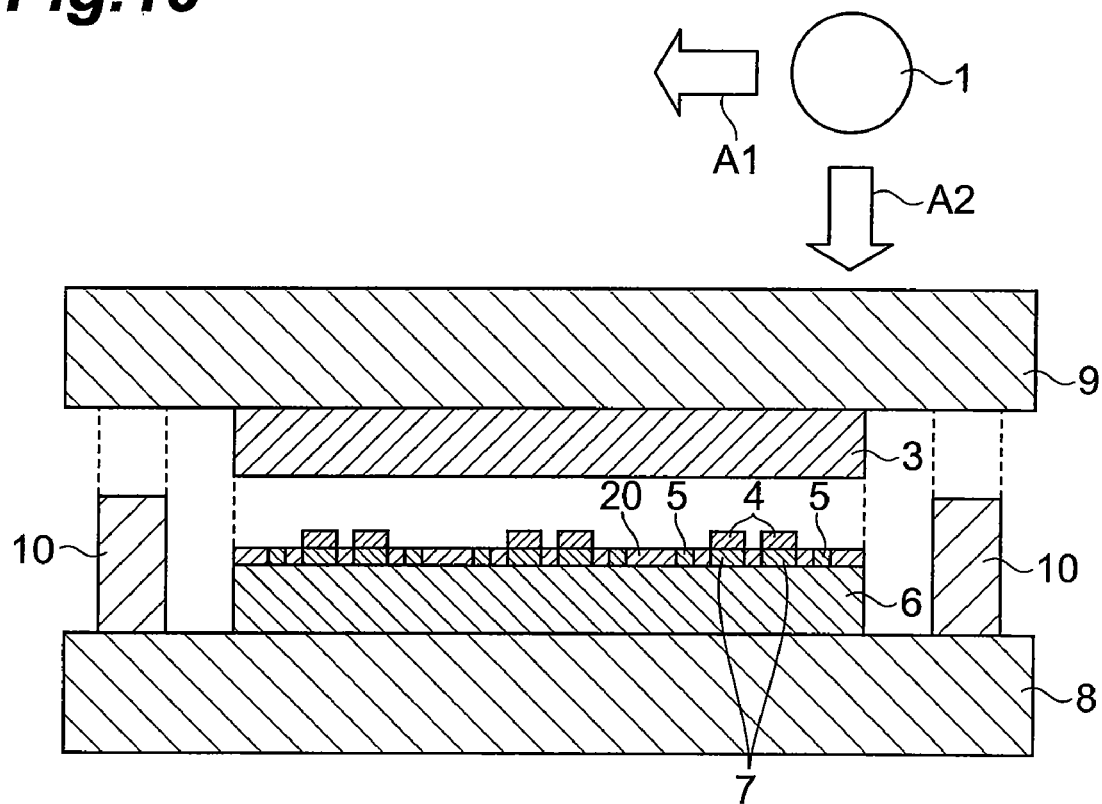
FIG. 10 is a process chart schematically showing a step in a method of manufacturing semiconductor devices according to a third embodiment.

FIG. 10 is a process chart schematically showing a step in a method of manufacturing semiconductor devices according to a third embodiment. In this embodiment, the adhesive layer 3 is formed on the dicing tape 9. The size of the adhesive layer 3 is processed in advance so as to be substantially the same as the size of the semiconductor wafer 6. On the other hand, the semiconductor wafer 6 and the dicing frame 10 are placed on the chuck 8. Thereafter, the semiconductor wafer 6 is arranged so that the circuit surface 6a thereof may face the adhesive layer 3 side, and then the dicing tape 9, in which the adhesive layer 3 is formed, is laminated onto the circuit surface 6a of the semiconductor wafer 6 using the roller 1. Thus, the structure shown in FIG. 4(B) is obtained. Thereafter, as in the first embodiment, the semiconductor device 50 shown in FIG. 8(B) can be manufactured. In this embodiment, the same operational effect as that of the first embodiment is obtained. Moreover, the separator 2 is not required and also the manufacturing steps of the semiconductor device 50 can be reduced.

As described above, the preferred embodiments of the present invention have been described in detail, but the present invention is not limited to the above-described embodiments.

EXAMPLES

Hereinafter, the present invention will be described more specifically based on examples and comparison examples, but the present invention is not limited to the following examples.

Example 1

As the thermosetting resin, 12 parts by mass of epoxy resin YDCN-703 (trade name, manufactured by Tohto Kasei Co., Ltd.) and 19 parts by mass of phenol aralkyl resin XLC-LL (trade name, manufactured by Mitsui Chemicals, Inc.); as the thermoplastic resin, 17 parts by mass of epoxy group containing acrylic rubber HTR-860P-3 (trade name, manufactured by Nagase ChemteX Corporation, average molecular weight of 800,000); and as the curing agent, 52 parts by mass of microcapsule-type curing agent HX-3941HP (trade name, manufactured by Asahi Chemical Industry Co., Ltd.), 100 parts by mass of spherical silica filler having an average particle diameter of 0.5 μm, and 4.3 parts by mass of gold plating plastic particle AU-203A (trade name, manufactured by Sekisui Chemical Co., Ltd.) having an average particle diameter of 3 μm are dissolved and dispersed in a mixed solvent of toluene and ethyl acetate. As a result, a varnish having an adhesive composition was obtained.

A part of this varnish was applied onto a separator (PET film) using a roll coater, and was then dried for 10 minutes in an oven of 70° C., thereby obtaining an adhesive sheet having an adhesive layer of 25 μm in thickness formed on the separator.

Next, the chuck of a die attach film mounter manufactured by JCM is heated up to 80° C., and then a 6-inch semiconductor wafer of 150 μm in thickness, in which a gold plating bump (16 μm in height) is formed in the circuit surface, was placed on the chuck with the gold plating bump facing upward. Back-grinding (#2000 finish) was performed to the rear surface of the semiconductor wafer. Then, the adhesive layer of an adhesive sheet, which was obtained by cutting an adhesive sheet comprising an adhesive layer and a separator into a rectangular shape of 200 mm×200 mm, was faced to the gold plating bump side of the semiconductor wafer and then the adhesive sheet was laminated onto the circuit surface of the semiconductor wafer. At this time, so as not to trap air, the adhesive sheet was pressed against the semiconductor wafer from the end of the semiconductor wafer using an attaching roller of the die attach film mounter.

After laminating, a protruding portion of the adhesive layer was cut along the contour of the semiconductor wafer (half cutting). Thereafter, the separator was peeled off. It was confirmed that there was neither void nor peeling of the adhesive layer caused by air trapping, and also confirmed that the tip of the gold plating bump does not protrude from the surface of the adhesive layer.

Then, a layered product comprising the semiconductor wafer and the adhesive layer was mounted on the chuck of the die attach film mounter with the adhesive layer facing upward. The stage temperature of the chuck was set to 40° C. Furthermore, a dicing frame for an 8-inch semiconductor wafer was disposed in the outer periphery of the semiconductor wafer. Subsequently, the adhesive face of a UV curing type dicing tape UC-334EP-110 (trade name, manufactured by Furukawa Electric Co., LTD.) was faced to the semiconductor wafer side, and then the dicing tape was laminated onto the semiconductor wafer and the dicing frame. At this time, so as not to trap air, the dicing tape was pressed against the semiconductor wafer and the dicing frame from the end of the dicing frame using the attaching roller of the die attach film mounter.

After laminating, the dicing tape was cut in the vicinity of an intermediate between the outer periphery and inner periphery of the dicing frame. This gave a layered product, in which the semiconductor wafer, the adhesive layer, and the dicing tape are stacked in this order, the layered product being fixed to the dicing frame.

The obtained layered product was mounted in a full automatic dicing saw DFD6361 (trade name, manufacture by Disco Inc.) with the rear surface facing upward. Then, using an IR camera attached to the full automatic dicing saw DFD6361, the alignment of the scribe line in the circuit surface was performed through the semiconductor wafer.

Next, at intervals of 15.1 mm on the long side and at intervals of 1.6 mm on the shorter side, in a first step, a part of the semiconductor wafer was cut (to a position of 100 μm in depth from the rear surface of the semiconductor wafer) under cutting conditions using a blade 27HEDD at a rotational speed of 40,000/min and at a cut speed of 50 mm/second. In a second step, the remainder of the semiconductor wafer, the adhesive layer, and a part of the dicing tape (95 μm) were cut under cutting conditions using the blade 27HCBB at a rotational speed of 30,000/min and at a cut speed of 50 mm/second.

Then, the cut layered-product was washed, and the moisture was dried off by blowing air onto the layered product. Furthermore, UV irradiation was performed to the layered product from the dicing tape side. Next, the semiconductor chip, upon which the adhesive layer is adhered, was pushed up from the dicing tape side and picked up and a semiconductor chip of 15.1 mm long×1.6 mm wide was obtained.

The rear surface of the obtained semiconductor chip was sucked to the adsorption head of a flip chip bonder CB-1050 (trade name, manufactured by Athlete FA Corporation). Thereafter, the semiconductor chip was moved to a predetermined position. Next, using an optical fiber illuminator with a flexible light guide, the alignment mark of the semiconductor chip was recognized by emitting light to the circuit surface of the semiconductor chip, upon which an adhesive layer is adhered, from diagonally downward.

Moreover, on an alkali-free glass substrate of 0.7 mm in thickness, an ITO substrate having an indium tin oxide (ITO) electrode of 140 nm in thickness formed therein was prepared. An alignment mark made of ITO formed in this ITO substrate was recognized. In this way, the alignment between the semiconductor chip and the ITO substrate was performed.

Then, under the heating conditions of 210° C. for 5 seconds, heating and pressurization were performed so that the pressure to the gold plating bump of the semiconductor chip becomes 50 MPa. Under the heating conditions of 210° C. for 5 seconds, the response rate of the adhesive layer calculated from the heat value by DSC was 98%. The adhesive layer was cured by thermocompression bonding, thereby electrically connecting the gold plating bump of the semiconductor chip to the ITO electrode of the ITO substrate and also mechanically bonding the semiconductor chip to the ITO substrate. In this way, the semiconductor device was fabricated.

<Evaluation Results of Semiconductor Chips>

The adhesive layer was dissolved by soaking the obtained semiconductor chip in a tetrahydrofuran solution, and thereafter the size of a crack occurred in the circuit surface of the semiconductor chip was measured using a measure scope. The result confirmed the presence of a semiconductor chip having a crack extending maximum 17 μm in the direction parallel to the circuit surface from the cutting plane of the semiconductor chip and extending maximum 10 μm in the depth direction from the circuit surface.

<Evaluation Results of the Semiconductor Device>

There was less resin within the adhesive layer wicking to the side face of the semiconductor chip, the adhesive layer having protruded during bonding. Moreover, the contamination of the adsorption head did not occur, either.

After bonding, as a result of the measurement of connection resistance value with a four-probe method, the connection resistance value was 0.5Ω (average value). Accordingly, it was confirmed that the gold plating bump of the semiconductor chip and the ITO electrode of the ITO substrate are excellently connected to each other.

Furthermore, in order to confirm the connection reliability, the connection resistance value was measured with the four probe method after leaving the semiconductor device in a high humidity-high temperature apparatus (60° C., 90% RH) for 1000 hours. As a result, the connection resistance value was 4Ω. Accordingly, it was confirmed that the bonding between the semiconductor chip and the ITO substrate provides excellent connection reliability.

Moreover, likewise, in order to confirm the connection reliability, the semiconductor device was provided in a temperature cycling test machine in which a condition of −40° C. for 15 minutes and a condition of 100° C. for 15 minutes are repeatedly set. The connection resistance value was measured with the four-probe method after 1000 cycles. As a result, the connection resistance value was 4Ω. Accordingly, it was confirmed that the bonding between the semiconductor chip and the ITO substrate provides excellent connection reliability.

Example 2

A semiconductor chip was fabricated as in Example 1 except that the layered product, in which the semiconductor wafer, the adhesive layer, and the dicing tape are stacked in this order, was diced as follows.

At intervals of 15.1 mm on the long side and at intervals of 1.6 mm on the shorter side, parts of the semiconductor wafer, the adhesive layer, and the dicing tape were cut (to a position of 190 μm in depth from the rear surface of the semiconductor wafer) under cutting conditions using the blade 27HEDD at a rotational speed of 40,000/min and at a cut speed of 50 mm/second. In Example 2, dicing was carried out in a single stage, not in two stages.

<Evaluation Results of Semiconductor Chips>

The adhesive layer was dissolved by soaking the obtained semiconductor chip in a tetrahydrofuran solution, and thereafter the size of a crack occurred in the circuit surface of the semiconductor chip was measured using a measure scope. The result confirmed the presence of a semiconductor chip having a crack extending maximum 69 μm in the direction parallel to the circuit surface from the cutting plane of the semiconductor chip and extending maximum 137 μm in the depth direction from the circuit surface.

Example 3

A semiconductor chip was fabricated as in Example 1 except that back-grinding is not performed to the rear surface of the semiconductor wafer. The thickness of the semiconductor wafer was 725 μm because back-grinding was not performed.

When carrying out alignment of the scribe line in the circuit surface using the IR camera, the transmission image by infrared light was not clear due to an effect of irregularities formed in the rear surface of the semiconductor wafer. For this reason, the alignment of the scribe line in the circuit surface was difficult. Accordingly, a line corresponding to the scribe line in the rear surface of the semiconductor wafer was formed and thereby the alignment of the scribe line in the circuit surface was performed.

Example 4

A semiconductor chip was fabricated as in Example 1 except that when obtaining a varnish of the bonding resin composition, the blending ratio of a spherical silica filler having an average particle diameter of 0.5 μm was set to 20 parts by mass. Moreover, using the obtained semiconductor chip, a semiconductor device was fabricated as in Example 1.

<Evaluation Results of Semiconductor Chips>

The adhesive layer was dissolved by soaking the obtained semiconductor chip in a tetrahydrofuran solution, and thereafter the size of a crack occurred in the circuit surface of the semiconductor chip was measured using a measure scope. The result confirmed the presence of a semiconductor chip having a crack extending maximum 25 μm in the direction parallel to the circuit surface from the cutting plane of the semiconductor chip and extending maximum 20 μm in the depth direction from the circuit surface.

<Evaluation Results of Semiconductor Devices>

There was less resin within the adhesive layer wicking to the side face of the semiconductor chip, the adhesive layer having protruded during bonding. Moreover, contamination of the adsorption head did not occur, either.

After bonding, as a result of measurement of the connection resistance value using the four probe method, the connection resistance value was 0.5Ω (average value). Accordingly, it was confirmed that the gold plating bump of the semiconductor chip and the ITO electrode of the ITO substrate are excellently connected to each other.

Furthermore, in order to confirm the connection reliability, the connection resistance value was measured using the four probe method after leaving the semiconductor device in a high humidity-high temperature apparatus (60° C., 90% RH) for 1000 hours. As a result, the connection resistance value was 80 Ω.

Moreover, likewise, in order to confirm the connection reliability, the semiconductor device was provided in a temperature cycling test machine in which a condition of −40° C. for 15 minutes and a condition of 100° C. for 15 minutes are repeatedly set. The connection resistance value was measured with the four-probe method after 1000 cycles. As a result, the connection resistance value was 30 Ω.

Example 5

A semiconductor chip was fabricated as in Example 1 except that when obtaining a varnish of the bonding resin composition, the blending ratio of epoxy resin YDCN-703 (trade name, manufactured by Tohto Kasei Co., Ltd.) was set to 40 parts by mass, the blending ratio of phenol aralkyl resin XLC-LL (trade name, manufactured by Mitsui Chemicals, Inc.) was set to 20 parts by mass, the blending ratio of epoxy group containing acrylic rubber HTR-860P-3 (trade name, manufactured by Nagase ChemteX Corporation, average molecular weight of 800,000) was set to 20 parts by mass, and the blending ratio of microcapsule-type curing agent HX-3941HP (trade name, manufactured by Asahi Chemical Industry Co., Ltd.) was set to 20 parts by mass.

Alignment of the obtained semiconductor chip with the ITO substrate was carried out as in Embodiment 1. Thereafter, under heating conditions of 210° C. for 5 second, heating and pressurization were performed so that the pressure to the gold plating bump of the semiconductor chip becomes 50 MPa. Under heating conditions of 210° C. for 5 seconds, the response rate of the adhesive layer calculated from the heat value by DSC was 60%. The adhesive layer was cured by thermocompression bonding, thereby electrically connecting the gold plating bump of the semiconductor chip to the ITO electrode of the ITO substrate and also mechanically bonding the semiconductor chip to the ITO substrate. In this way, the semiconductor device was fabricated.

<Evaluation Results of Semiconductor Chips>

The adhesive layer was dissolved by soaking the obtained semiconductor chip in a tetrahydrofuran solution, and thereafter the size of a crack occurred in the circuit surface of the semiconductor chip was measured using the measure scope. The result confirmed the presence of a semiconductor chip having a crack extending maximum 17 μm in the direction parallel to the circuit surface from the cutting plane of the semiconductor chip and extending maximum 10 μm in the depth direction from the circuit surface.

<Evaluation Results of Semiconductor Devices>

There was less resin within the adhesive layer wicking to the side face of the semiconductor chip, the adhesive layer having protruded during bonding. Moreover, the contamination of the adsorption head did not occur, either.

After bonding, as a result of measurement of the connection resistance value using the four probe method, the connection resistance value was 4Ω (average value).

Furthermore, in order to confirm the connection reliability, the connection resistance value was measured using the four probe method after leaving the semiconductor device in a high humidity-high temperature apparatus (60° C., 90% RH) for 1000 hours. As a result, the connection resistance value was 60 Ω.

Moreover, likewise, in order to confirm the connection reliability, the semiconductor device was provided in a temperature cycling test machine in which a condition of −40° C. for 15 minutes and a condition of 100° C. for 15 minutes are repeatedly set. The connection resistance value was measured with the four-probe method after 1000 cycles. As a result, the connection resistance value was 20 Ω.

Comparative Example 1

An adhesive sheet obtained as in Example 1 was laminated onto the circuit surface of the semiconductor wafer. After laminating, the protruding portions of the separator and the adhesive layer were cut along the contour of the semiconductor wafer.

Then, a layered product, in which the separator, the adhesive layer, and the semiconductor wafer are stacked in this order, was placed on the chuck of the die attach film mounter with the rear surface of the semiconductor wafer facing upward. The stage temperature of the chuck was set to 40° C. Furthermore, a dicing frame for an 8-inch semiconductor wafer was disposed in the outer periphery of the semiconductor wafer. Subsequently, the adhesive surface of a UV curing type dicing tape UC-334EP-110 (trade name, manufactured by Furukawa Electric Co., LTD.) was faced to the rear surface of the semiconductor wafer, and then the dicing tape was laminated onto the semiconductor wafer and the dicing frame.

After laminating, the dicing tape was cut in the vicinity of an intermediate between the outer periphery and inner periphery of the dicing frame. Thereafter, the separator was peeled off from the adhesive layer. This gave a layered product, in which the adhesive layer, the semiconductor wafer, and the dicing tape are stacked in this order, the layered product being fixed to the dicing frame.

A semiconductor chip was obtained by dicing the obtained layered product as in Example 1. It was confirmed that chips during dicing are stuck to the surface of the adhesive layer adhering to this semiconductor chip. For this reason, the obtained semiconductor chip could not be aligned with the ITO substrate.

Comparative Example 2

An adhesive sheet comprising an adhesive layer and a separator was obtained as in Example 1. This adhesive sheet was cut into a rectangular shape of 280 mm×280 mm. Moreover, as in Example 1, the semiconductor wafer was placed on the chuck of the die attach film mounter manufactured by JCM.

Subsequently, a double-sided tape ("Naisutakku" registered trademark, manufactured by Nichiban Co., Ltd.) was stuck onto a dicing frame for an 8-inch wafer, and then the dicing frame was disposed in the outer periphery of the semiconductor wafer, with the surface, onto which the double-sided tape is stuck, facing upward and the cover film of the double-sided tape removed. Next, the adhesive layer of the adhesive sheet cut into 280 mm×280 mm for each separator was faced to the circuit surface side of the semiconductor wafer, and then the adhesive layer of the adhesive sheet was applied onto the double-sided tape on the dicing frame and the adhesive sheet was laminated onto the semiconductor wafer. At this time, so as not to trap air, the adhesive layer was pressed against the semiconductor wafer and the dicing frame from the end of the dicing frame using the attaching roller of the die attach film mounter.

After laminating, the adhesive layer and the separator were cut along the outer periphery of the dicing frame. This gave a layered product, in which the semiconductor wafer, the adhesive layer, and the separator are stacked in this order, the layered product being fixed to the dicing frame via the double-sided tape.

The obtained layered product was mounted in a full automatic dicing saw DFD6361 (trade name, manufacture by Disco Inc.) with the rear surface of the semiconductor wafer facing upward. Then, using an IR camera attached to the full automatic dicing saw DFD6361, the alignment of a scribe line in the circuit surface was performed through the semiconductor wafer.

Next, at intervals of 15.1 mm on the long side and at intervals of 1.6 mm on the shorter side, in a first step, a part of the semiconductor wafer was cut (to a position of 100 µm in depth from the rear surface of the semiconductor wafer) under cutting conditions using the blade 27HEDD at a rotational speed of 40,000/min and at a cut speed of 50 mm/second. In a second step, the remainder of the semiconductor wafer, and parts of the adhesive layer and the separator (95 µm) were cut under cutting conditions using the blade 27HCBB at a rotational speed of 30,000/min and at a cut speed of 50 mm/second.

However, since peeling occurred at the interface between the adhesive layer and the separator, the semiconductor chips obtained by dicing scattered and spilled out due to a stream for washing. For this reason, the semiconductor chip upon which the adhesive layer is adhered could not be obtained.

INDUSTRIAL APPLICABILITY

According to the present invention, since the cutting position is recognized by recognizing a circuit pattern in the circuit surface from the surface opposite to the circuit surface of the semiconductor wafer, a pollution-free singulated semiconductor chip can be obtained. Moreover, since a wafer is fixed using a dicing tape, a singulated semiconductor chip will neither scatter nor spill out to be lost and accordingly a method of manufacturing semiconductor devices and the adhesive film used in this method of manufacturing semiconductor devices are provided efficiently.

The invention claimed is:

1. A method of manufacturing semiconductor devices, comprising the steps of:
   preparing a layered product in which a dicing tape, an adhesive layer, and a semiconductor wafer are stacked in this order so that a circuit surface of the semiconductor wafer may face the dicing tape side;
   recognizing a cutting position by recognizing a circuit pattern in the circuit surface from a surface opposite to the circuit surface of the semiconductor wafer;
   cutting at least the semiconductor wafer and the adhesive layer in a thickness direction of the layered product after recognizing the cutting position;
   fabricating a semiconductor chip, upon which the adhesive layer is adhered, by curing the dicing tape after the cutting step, and then peeling off the dicing tape and the adhesive layer;
   aligning a terminal in the circuit surface of the semiconductor chip, upon which the adhesive layer is adhered, with a wiring of a wiring substrate; and
   bonding the wiring substrate and the semiconductor chip via the adhesive layer so that the wiring of the wiring substrate and the terminal of the semiconductor chip may be electrically connected to each other.

2. The method of manufacturing semiconductor devices according to claim 1, wherein the step of cutting at least the semiconductor wafer and the adhesive layer comprises:
   a first step of cutting a part of the semiconductor wafer; and
   a second step of cutting a remainder of the semiconductor wafer and the adhesive layer.

3. The method of manufacturing semiconductor devices according to claim 1, wherein in the step of recognizing the cutting position, the circuit pattern is recognized through the semiconductor wafer.

4. The method of manufacturing semiconductor devices according to claim 3, wherein the circuit pattern is recognized using an infrared camera.

5. The method of manufacturing semiconductor devices according to claim 4, wherein the surface opposite to the circuit surface of the semiconductor wafer is planarized by polishing.

6. The method of manufacturing semiconductor devices according to claim 1, wherein in the step of aligning the terminal of the semiconductor chip with the wiring of the wiring substrate, the circuit surface of the semiconductor chip is observed through the adhesive layer adhering to the semiconductor chip.

7. The method of manufacturing semiconductor devices according to claim 6, wherein the circuit surface of the semiconductor chip is observed by emitting light to the adhesive layer from a direction inclined to a normal direction of a surface of the adhesive layer.

8. The method of manufacturing semiconductor devices according to claim 1, wherein the circuit surface of the semiconductor chip is observed using a camera having a polarizing filter.

9. An adhesive film which bonds a semiconductor chip and a wiring substrate by being cured by pressurization and heating, and which electrically connects a wiring of the wiring substrate to a terminal of the semiconductor chip, the adhesive film being used in the method of manufacturing semiconductor devices according to claim 1, the adhesive film comprising a resin composition containing a thermoplastic resin, a thermosetting resin, and a curing agent, and a filler, and the adhesive film containing 20 to 100 parts by mass of the filler relative to 100 parts by mass of the resin composition, wherein when the adhesive film is heated for 5 to 20 seconds at temperature in a range of 170 to 240° C., a response rate of the adhesive film calculated from a heat value by DSC (differential scanning calorimeter) is no less than 50%.

10. The method of manufacturing semiconductor devices according to claim 2, wherein in the step of aligning the terminal of the semiconductor chip with the wiring of the wiring substrate, the circuit surface of the semiconductor chip is observed through the adhesive layer adhering to the semiconductor chip.

11. The method of manufacturing semiconductor devices according to claim 3, wherein in the step of aligning the terminal of the semiconductor chip with the wiring of the wiring substrate, the circuit surface of the semiconductor chip is observed through the adhesive layer adhering to the semiconductor chip.

12. The method of manufacturing semiconductor devices according to claim 4, wherein in the step of aligning the terminal of the semiconductor chip with the wiring of the wiring substrate, the circuit surface of the semiconductor chip is observed through the adhesive layer adhering to the semiconductor chip.

13. The method of manufacturing semiconductor devices according to claim 5, wherein in the step of aligning the terminal of the semiconductor chip with the wiring of the wiring substrate, the circuit surface of the semiconductor chip is observed through the adhesive layer adhering to the semiconductor chip.

* * * * *